US010656206B1

(12) United States Patent
Patil et al.

(10) Patent No.: US 10,656,206 B1
(45) Date of Patent: May 19, 2020

(54) MULTI-FUNCTION ELECTRONIC DEVICE TESTING

(71) Applicant: Amazon Technologies, Inc., Seattle, WA (US)

(72) Inventors: Prashanth Basavaraj Patil, Santa Clara, CA (US); San-Ching De La Cruz, Santa Clara, CA (US)

(73) Assignee: Amazon Technologies, Inc., Seattle, WA (US)

(*) Notice: Subject to any disclaimer, the term of this patent is extended or adjusted under 35 U.S.C. 154(b) by 278 days.

(21) Appl. No.: 15/595,312

(22) Filed: May 15, 2017

(51) Int. Cl.
*G06Q 10/08* (2012.01)
*G01R 31/319* (2006.01)
*G01R 31/01* (2020.01)
*G01R 31/28* (2006.01)

(52) U.S. Cl.
CPC ....... *G01R 31/31905* (2013.01); *G01R 31/01* (2013.01); *G01R 31/2834* (2013.01); *G01R 31/31908* (2013.01)

(58) Field of Classification Search
CPC .. G06Q 10/087; G06Q 10/08; G06Q 10/0832; G06Q 10/083; G06Q 50/28; B25J 9/1664; B25J 9/1697; B25J 9/0084; B25J 9/1602; B25J 9/1612; B25J 9/1669
See application file for complete search history.

(56) References Cited

U.S. PATENT DOCUMENTS

| | | | | |
|---|---|---|---|---|
| 7,126,098 | B2 * | 10/2006 | Nakamura | G02B 7/08 250/201.2 |
| 8,761,938 | B2 | 6/2014 | Jenkinson et al. | |
| 9,151,693 | B1 * | 10/2015 | Yang | H04M 1/24 |
| 2002/0071117 | A1 * | 6/2002 | Ukon | G01J 3/443 356/316 |
| 2015/0005579 | A1 * | 1/2015 | Yamabe | G02B 23/26 600/109 |
| 2016/0337053 | A1 * | 11/2016 | Diperna | G05B 19/41875 |
| 2017/0280135 | A1 * | 9/2017 | Shroff | G06T 7/80 |

OTHER PUBLICATIONS

Orbis/systems, "MMI Test Box Integrated smartphone tester," retrieved on Apr. 18, 2017 from <<http://www.orbissystems.eu/site/assets/files/1155/orbis_systems_mmi_brochure.pdf>> 7 pages.
Wikipedia, "Functional testing (manufacturing)," retrieved on Apr. 18, 2017 from <<https://en.wikipedia.org/wiki/Functional_testing_(manufacturing)>> last modified on Mar. 30, 2017, 2 pages.

* cited by examiner

*Primary Examiner* — Alesa Allgood
(74) *Attorney, Agent, or Firm* — Lee & Hayes, P.C.

(57) ABSTRACT

A multi-function test machine includes a table assembly, a robotic arm, one or more stimulators, one or more sensors, and a computing device for testing electronic devices. The multi-function tester may also include a camera test assembly and a universal device holder. The multi-function tester is capable of testing multiple systems of an electronic device concurrently, thus obviating the need for multiple test stations and operators.

20 Claims, 10 Drawing Sheets

MULTI-FUNCTION ELECTRONIC DEVICE TESTING

BACKGROUND

Electronic devices come in many different shapes and sizes. During manufacturing and/or assembly, electronic devices go through one or more quality control functional tests to make sure that the electronic device is functioning properly. Typically, multiple different test stations are used to test different functions of the electronic devices. For instance, a camera test station is used to test the performance and functionality of one or more cameras of the electronic device, a touch screen test station may be used to test the functionality of a touch screen of the electronic device, a WiFi test station may be used to test the functionality of a WiFi radio of the electronic device, etc.

Each test station occupies space in the manufacturing/assembly line and takes an operator to operate the test station. Further, unless the test station is dedicated to a particular device, the test station must be reconfigured in order to test different types of electronic devices. Thus, the current approach to testing devices is inefficient in terms of the space required for the test equipment, the manpower required to operate the test equipment, and the time required to perform the testing and to reconfigure the equipment to test other types of electronic devices.

BRIEF DESCRIPTION OF THE DRAWINGS

The detailed description references the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the components on a larger scale or differently shaped for the sake of clarity.

DETAILED DESCRIPTION

Overview

Figure 1:
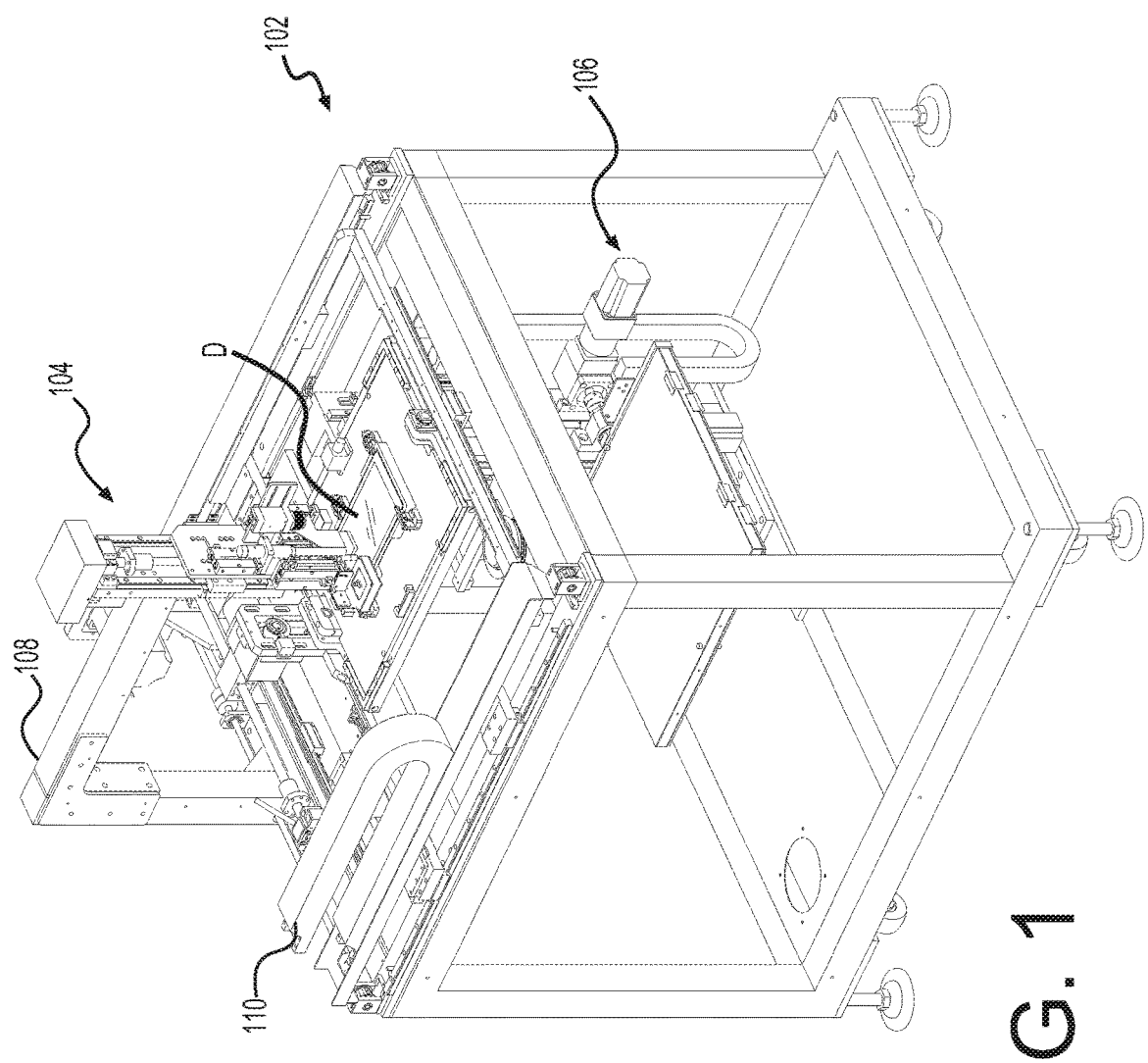
FIG. 1 is perspective view of an example multi-function test machine usable to test multiple different functions of electronic devices.

As discussed above, during manufacture and/or assembly of electronic devices, the electronic devices traditionally undergo one or more tests to make sure systems of the electronic devices are functioning properly. These tests generally employ different stations that are used to test unique functions. This necessitates multiple test stations along a manufacture/assembly line, each station having an operator to run the test station. Also, the time to move the electronic device from station to station to test multiple different systems is time consuming. Furthermore, electronic devices vary greatly in size and shape, and may have differing structural and/or functional capabilities. As such, test stations typically must be reconfigured to test different types of electronic devices. Thus, this approach to functional testing electronic devices is inefficient in terms of space, time, and labor.

This application describes a multi-function tester that is capable of concurrently testing multiple systems of an electronic device. By concurrently testing multiple systems of the electronic device at a single test station, the multi-function tester greatly reduces the time and labor required to test each device, as well as the space occupied by test equipment. In some examples, the multi-function tester may include a table assembly comprising a fixture to hold an electronic device under test, one or more robotic arms coupled to the table assembly, one or more stimulators to apply stimulus (e.g., touch, sound, light, magnetic field, radio frequency transmission, etc.) to the electronic device, and one or more sensors to sense outputs (e.g., displayed content, projected content, light, sound, vibration, radio frequency transmission, etc.). As used herein, the term "stimulator" means any device configured to apply a stimulus to the electronic device. By way of example and not limitation, stimulators may include touch screen/sensor probes, physical button press probes, speakers or audio emitters, light emitters, magnetic field emitters/probes, fingerprint sensor probes, global positioning sensor (GPS) emitters, AM/FM radio emitters, and antennas. As used herein, the term "sensor" means any device configured to sense an output from the device. By way of example and not limitation, sensors may include still and/or video cameras, light sensors, microphones, inertial sensors, optical or laser scanners, and antennas. In other examples, an external sensor may be coupled to the electronic device under test and/or may comprise a portion of the fixture, described further herein below. The one or more stimulators and the one or more sensors may be disposed on, coupled to, or integrated with the table assembly or the robotic arm. In some examples, each of the table assembly and the robotic arm may include one or more stimulators and/or one or more sensors.

The multi-function tester may, in some examples, include a camera test assembly to support a chart for testing the functionality of one or more cameras of the electronic device. A computing device may be communicatively coupled to the table assembly, the robotic arm(s), and/or the camera test assembly in order to control operation of the various assemblies of the multi-function tester. The computing device may additionally or alternatively be communicatively coupled to the electronic device being tested to control operation of the electronic device and/or to monitor and record inputs received by the electronic device during testing.

In some examples, the table assembly may include a fixture to hold an electronic device during testing. The fixture may be adjustable in order to accommodate multiple different sizes, shapes, and configurations of electronic devices. The fixture allows for adjustment in multiple directions (e.g., x, y, and/or z directions) to accommodate electronic devices that comprise different dimensions. By way of example and not limitation, the fixture may be configured to hold electronic devices that are substantially planar (e.g., tablets, smartphones, eBook readers, gaming devices, etc.) and electronic devices that are substantially cylindrical (e.g., virtual assistants, audio input/output devices, speakers, etc.). The table assembly may include a stationary frame having a substantially planar top surface. The stationary frame may provide a structural platform to which different components of the multi-function tester may be joined. The table assembly may also include a movable frame. The movable frame may be movable in at least one axis (e.g., x and/or y axes) substantially parallel to the substantially planar top surface of the stationary frame. The table assembly may further include a rotatable plate. The rotatable plate may be coupled to, and movable with, the movable frame. The above-described fixture may be mounted to the rotatable plate and may be rotatable about an axis parallel to the substantially planar top surface of the stationary frame (e.g., an axis parallel to the x or y axis) to invert the fixture and the device under test. In some examples, the rotatable plate may include an opening so that a rear facing camera of the device is oriented toward and exposed to the camera test assembly located below the table assembly for testing of the rear facing camera. In that case, rotation of the rotating plate inverts the electronic device such that a front facing camera of the electronic device is oriented toward the camera test assembly for testing of the front facing camera.

As discussed above, the multi-function tester includes one or more robotic arms that may be coupled to the table assembly. In some examples, a single robotic arm may be used. In that case, the robotic arm of the multi-function tester may include at least one stimulator to stimulate an input of the electronic device under test. The robotic arm may additionally or alternatively include at least one sensor to sense an output of the electronic device under test. By way of example and not limitation, the stimulator(s) of the robotic arm may include at least one electromagnetic probe, touch screen probe, button press probe, speaker, light source, antenna, and/or any other stimulator that may be used to apply a stimulus to test an input on an electronic device. Also by way of example and not limitation, the sensor(s) of the robotic arm may include at least one microphone, camera, antenna, and/or any other sensor that may be used to test output of an electronic device. The multi-function tester may further include an L-shaped bracket coupling the robotic arm to the table assembly, such that the robotic arm is disposed above and substantially centered over a top of the table assembly.

As discussed above, in some examples, the multi-function tester may further include a camera test assembly. When included, the camera test assembly may be disposed below the fixture of the table assembly and may support a chart at a position that is aligned with a camera of the electronic device under test. The camera test assembly may further include a chart holder to hold the chart, an adjustable stand to move the chart holder to position the chart at the position that is aligned relative to the camera of the electronic device under test. The camera test assembly may, in some examples, also include a relay lens coupled to the adjustable stand. The relay lens may be interposed in an optical path between a camera of the electronic device under test and the chart. The relay lens may be movable to adjust a relative position of the relay lens between the camera of the electronic device and the chart. The mobility of the relay lens allows the camera test assembly to simulate an image at a plurality of distances from the electronic device under test.

The multi-function tester may also include a computing device communicatively coupled to the table assembly, the robotic arm, and the camera test assembly. The computing device may include one or more processors and a memory storing a test procedure for the electronic device under test. In some examples, the memory may store multiple different test procedures corresponding to multiple different devices that the multi-function tester is configured to test. The computing device may also include a wired or wireless interface for communication with the device under test. The test procedure stored on the memory for a particular electronic device, when executed by the one or more processors, causes the multi-function tester to concurrently test multiple systems of the particular electronic device under test.

The techniques described herein may be applied to a wide variety of electronic devices and multi-function testers. In some examples, the electronic devices may include a display screen. Examples of electronic devices including display screens include, by way of example and not limitation, tablet computing devices, mobile devices (e.g., cell phones, smart phones, etc.), electronic book reader devices, laptop or all-in-one computers, media players, portable gaming devices, televisions, monitors, cameras, wearable computing devices, and electronic picture frames. However, the techniques described herein may additionally or alternatively be used to test electronic devise that do not include a display screen, such as, for example, audio virtual assistant devices, augmented reality devices, virtual reality devices, radios, speakers, personal computers, external hard drives, input/output devices (e.g., remote controls, game controllers, keyboards, mice, touch pads, microphones, speakers, etc.), and the like. The particular configuration of the fixtures, stimulators, and sensors included in the multi-function tester may be chosen based on the specific electronic devices to be tested so as to thoroughly test all or a subset of the inputs and outputs of the electronic devices to be tested.

Additional details of these and other examples are described below with reference to the drawings.

Example Multi-Function Test Machine

Figure 2:
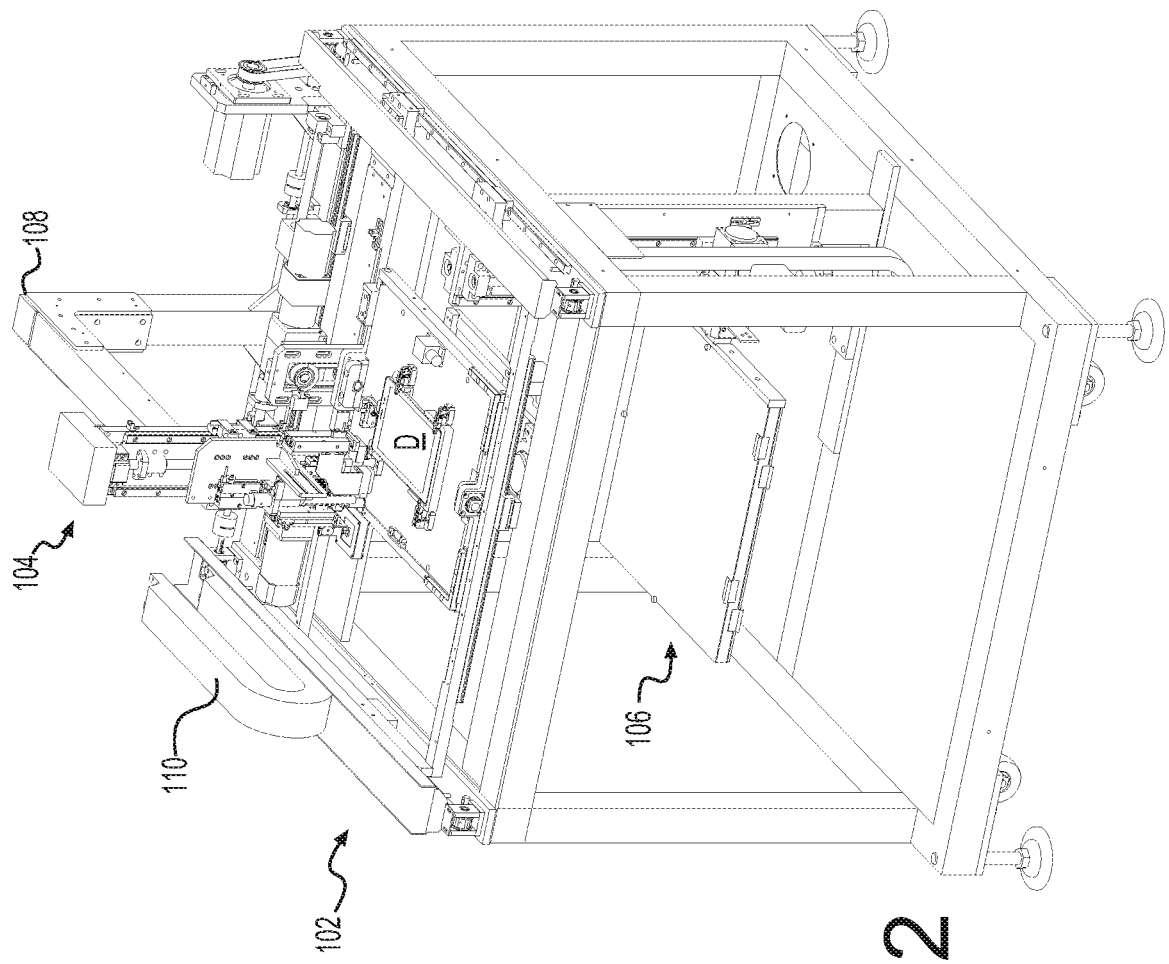
FIG. 2 is a second perspective view of the example multi-function test machine of FIG. 1.

FIG. 1 depicts a perspective view of an example multi-function test machine 100 usable to test multiple different functions of electronic devices. The multi-function test machine 100 may include one or more of a table assembly 102, a robotic arm 104, and a camera test assembly 106. The multi-function test machine 100 may also include a housing (not shown) to provide an enclosed space for testing electronic devices. The housing may enclose all or part of the multi-function test machine 100 and/or may shield all or part of the multi-function test machine 100 from environmental conditions (e.g., ambient light, sound, vibrations, air flow, etc.). A computing device may optionally be disposed in, on, or attached to the housing. However, in other examples, the computing device may be attached to the table assembly 102 or the computing device my reside elsewhere within the environment. FIG. 2 depicts a second perspective view of the example multi-function test machine 100. In some examples, the table assembly 102, robotic arm 104, and camera test assembly 106 may be located as depicted in FIGS. 1 and 2. In other examples, the individual assemblies may be positioned in alternate locations or orientations. The multi-function test machine 100 may also include an L-shaped bracket 108 coupling the robotic arm 104 to the table assembly 102, such that the robotic arm 104 is disposed above the top of the table assembly 102, as seen in FIGS. 1 and 2. The L-shaped bracket 108 is depicted as being rigid and stationary, but in other examples the L-shaped bracket 108 may comprise movable parts to allow further mobility of individual components of the multi-function test machine 100. The multi-function test machine 100 may also include a cable routing belt 110. The cable routing belt 110 allows the table assembly 102 to have mobility without binding any cables.

Figure 3:
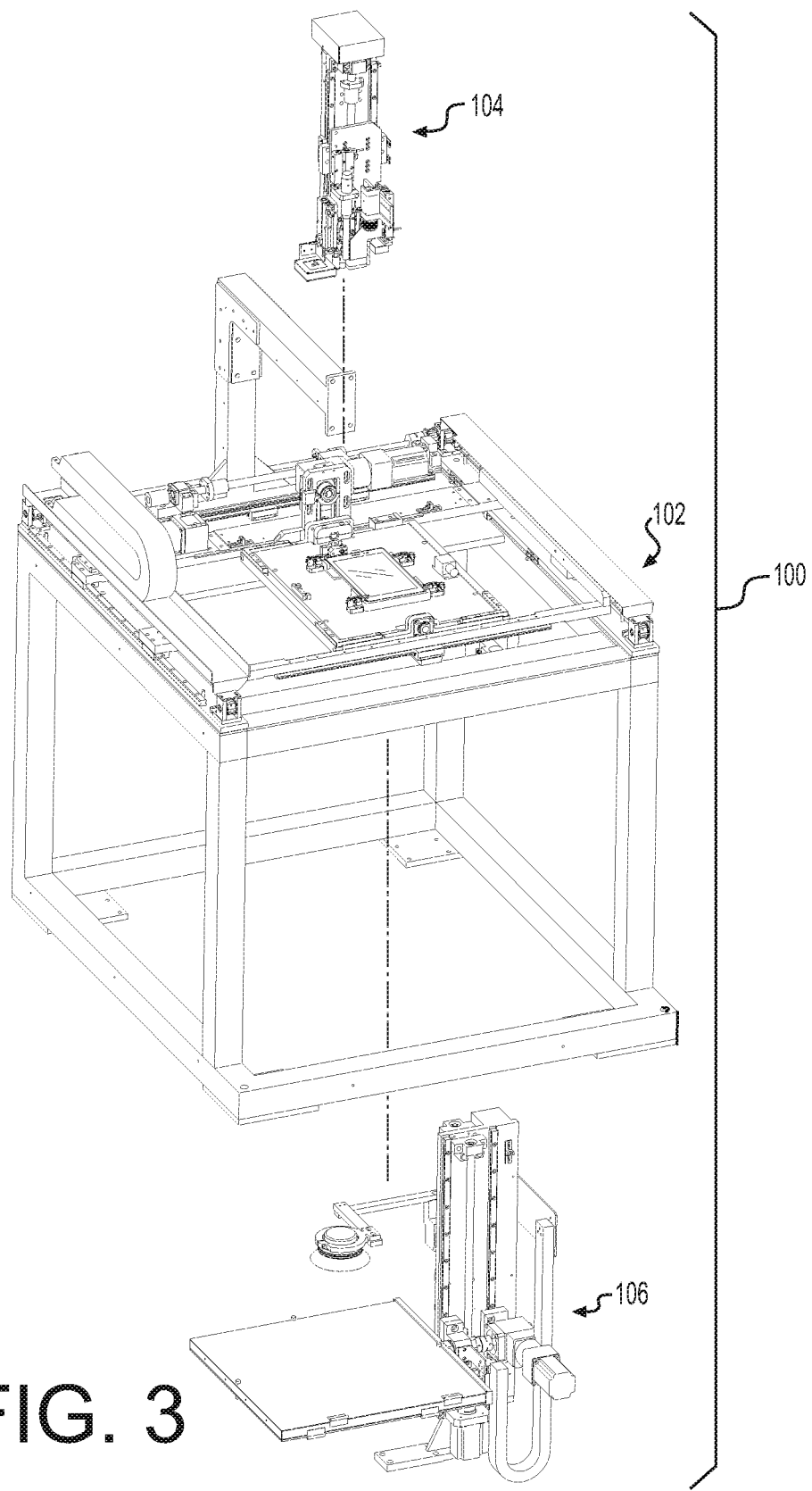
FIG. 3 is an exploded view of the example multi-function test machine of FIG. 1, illustrating a universal table, a probe assembly, and camera test assembly.

FIG. 3 depicts an exploded view of the example multi-function test machine shown in FIG. 1. FIG. 3 illustrates the table assembly 102, robotic arm 104, and camera test assembly 106 in an exploded view. This figure depicts the assemblies that comprise the multi-function test machine 100. For purpose of clarity, these assemblies may be referred to and described as individual components, but work in conjunction to provide the testing capability of the multi-function test machine 100.

Figure 4:
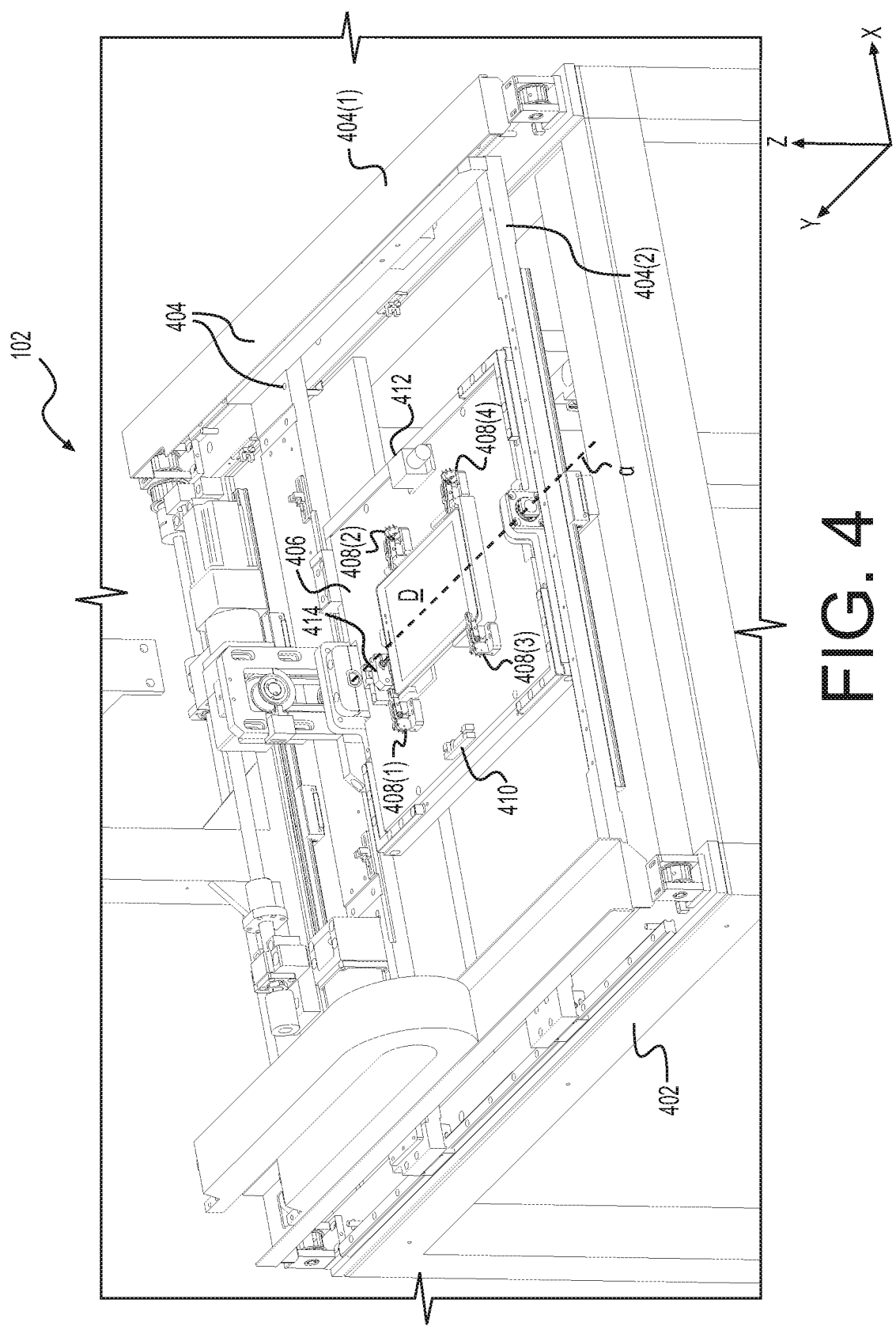
FIG. 4 is a detailed view of the universal table of the example multi-function test machine of FIG. 1.

FIG. 4 depicts a detailed view of the table assembly 102 of the example multi-function test machine 100. The table assembly 102 may include a stationary frame 402. The stationary frame 402 may provide support and structure to which other features of the multi-function test machine 100 and the table assembly 102 may be coupled. The stationary frame 402 may have a substantially planar top surface generally corresponding to the x-y plane shown in the figures. The L-shaped bracket 108, previously described, may be coupled to a portion of the stationary frame 402. The stationary frame 402 may further provide support for the camera test assembly 106, discussed further herein below.

The table assembly 102 depicted in FIG. 4 may also include a movable frame 404. In some examples, the movable frame 404 may be movable in at least one axis substantially parallel to the substantially planar top surface of the stationary frame 402. However, in other examples, the movable frame 404 may be movable in more than one axis and may be movable in x, y, and/or z directions. The movable frame 404 may include a fixed portion 404(1) that is coupled to the stationary frame 402 and a dynamic portion 404(2) that is movable in at least one axis. The dynamic portion 404(2) may slide on rails, roll on bearings, actuate using hydraulics, or may employ other mechanisms that provide the desired mobility.

The table assembly 102 may further include a rotatable plate 406, as depicted in FIG. 4. The rotatable plate 406 may be coupled to the movable frame 404, and therefore, may be movable with the movable frame 404. The rotatable plate 406 may be rotatable about an axis (a) parallel to the substantially planar top surface of the stationary frame 402. This rotational capability of the rotatable plate 406 allows the rotatable plate to invert an electronic device under test that is held by a fixture, described further herein below. The rotatable plate 406 may rotate using gears, pulleys, belts, or other mechanisms that provide rotational movement. The rotatable plate 406 may have a variety of sensors, stimulators, and/or gauges coupled thereto. By way of example and not limitation, the rotatable plate 406 may include on or more inclinometers, level gauges, microphones, speakers, wireless antennae, audio jacks, a variety of stimulus probes, lights, cameras, etc. The rotatable plate 406 may also include one or more holes through which a camera of the electronic device may capture images of the camera test assembly 106 with an unobstructed line of sight.

Coupled to the rotatable plate 406 may be a fixture 408 (or universal holder) to hold an electronic device under test. The fixture 408 may be configured to be able to receive a variety of different electronic devices. The fixture 408 may include clamps that automatically actuate to secure the device in the fixture 408 and to the rotatable plate 406. However, in other examples, the clamps may be actuated manually by an operator of the multi-function test machine 100. This allows the rotatable table 406 to safely invert and/or manipulate the electronic device under test. The fixture 408 may be able to automatically align a camera of the electronic device with the hole in the rotatable plate 406. However, in other examples, an operator may align the electronic device in the fixture 408. The fixture 408 may be configured to adjust width, height, and/or thickness to accommodate a plurality of sizes and shapes of electronic devices. In some examples, the fixture may be adjustable between approximately 5 inches and approximately 12 inches. However, in other examples, the fixture 408 may be adjustable to accommodate larger or smaller dimensions, such as between approximately 1 inch and 16 inches. In other examples, fixture 408 may further be configured to receive cylindrical electronic devices. For example, the fixture 408 may be configured to adjustably accommodate cylindrical devices having heights between approximately 1 inch and approximately 12 inches and diameters between approximately 1 inch and approximately 8 inches. The rotatable plate 406 may also include one or more speakers 410, level gauges 412, and/or audio jacks 414 on a push/pull mount.

Figure 5:
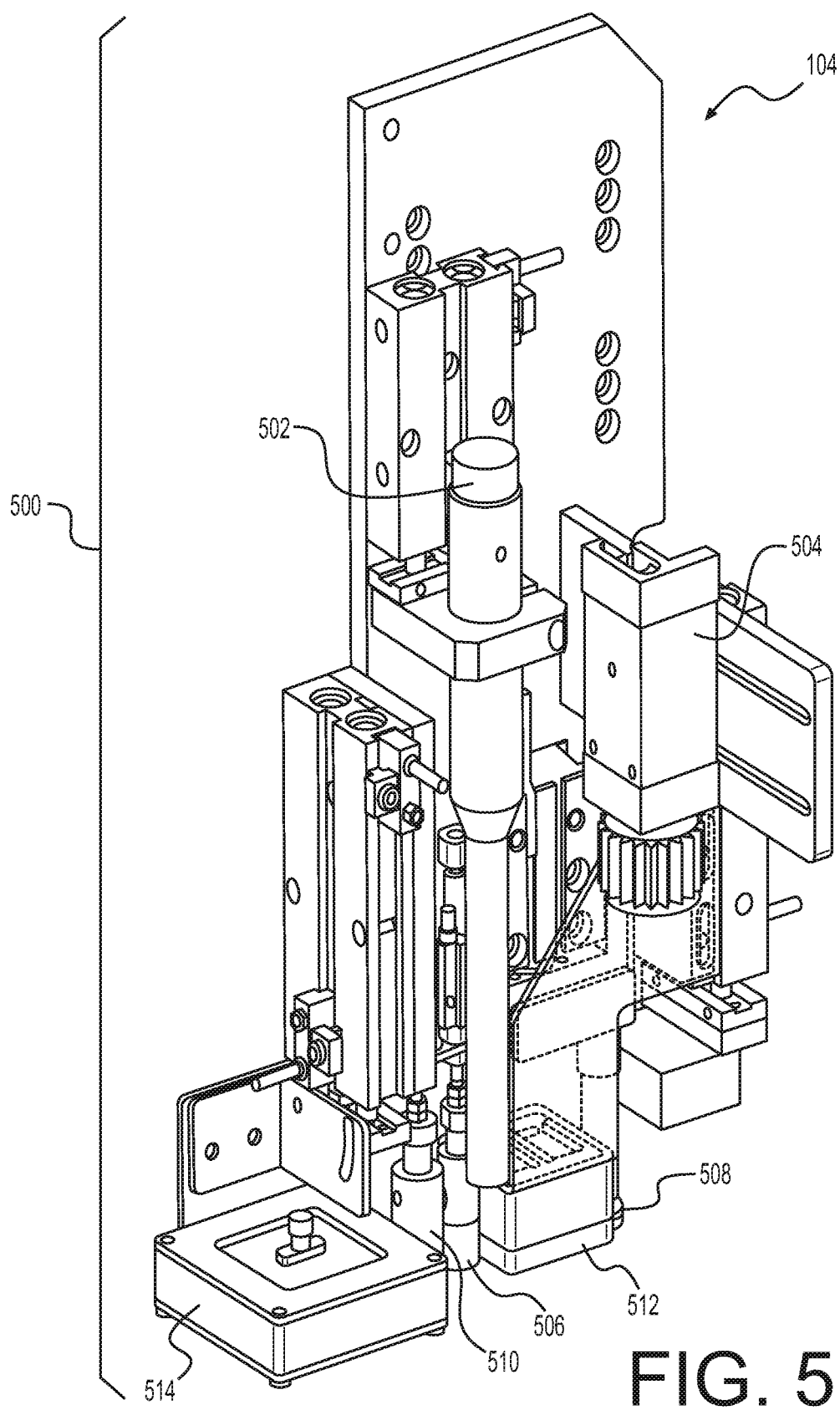
FIG. 5 is a detailed view of the probe assembly of the example multi-function test machine of FIG. 1.

FIG. 5 depicts a detailed view of the robotic arm 104 of the example multi-function test machine 100. As shown, the robotic arm 104 includes a probe assembly 500. The robotic arm 104 may be coupled to the L-shaped bracket 108, shown in FIG. 1, so as to position the robotic arm 104 over the top of the electronic device under test. The robotic arm 104 may be movable in x, y, and/or z directions. Furthermore, one or more of the stimulators and/or sensors attached to the probe assembly 500 of the robotic arm 104 may additionally or alternatively be movable relative to the robotic arm in the x, y, and/or z directions. By virtue of being mounted on the robotic arm 104, the sensor(s) and/or stimulator(s) may be moved to different locations around the electronic device to test different outputs of the electronic device. For instance, a microphone sensor can be moved into proximity of a speaker of the electronic device, or an ambient light emitter stimulator can be moved to a predetermined spacing aligned with an ambient light sensor of the electronic device. The robotic arm 104 is described further herein below by way of example and not limitation. Other example combinations of stimulators, sensors, probes, lights, cameras, etc., are possible.

The robotic arm 104 may include one or more sensors. The one or more sensors may be used to test an output of the electronic device under test. For example the robotic arm 104 may include one or more microphones 502. The microphone 502 may be used to test one or more speakers of the electronic device by detecting audio output by the one or more speakers of the electronic device. The robotic arm 104 may further include one or more cameras. For example, the robotic arm may include a charge coupled device (CCD) camera 504. The CCD camera 504 may be used to test a display screen of the electronic device. For example, the CCD camera 504 may test the resolution of the display to detect any dead pixels, hot pixels, and/or differentiate the color pattern of the display screen. Additionally or alternatively, the robotic arm 104 may include a blemish camera to detect physical blemishes or flaws in the display screen and/or the housing of the electronic device.

The robotic arm 104 may additionally or alternatively include one or more stimulators. The one or more stimulators may be used to test inputs of the electronic device under test. For example, the robotic arm 104 may include a touch screen probe 506. The touch screen probe 506 may be used to test a touch screen display screen of the electronic device to ensure whether the touch screen is operating properly (e.g., is accurately detecting touches over the extent of the display screen and/or is detecting the touches at the relative locations at which the touches are actually applied to the touch screen). The robotic arm 104 may also include a button press probe 508. The button press probe 508 may be used to activate one or more physical buttons on the electronic device to ensure proper functionality. The robotic arm 104 may also include one or more electromagnet probes 510. The electromagnet probe 510 may be used to test that a Hall sensor or other magnetic sensor of the electronic device is functioning properly. The robotic arm 104 may further include a light source 512. The light source 512 may comprise at least one of: light-emitting diodes (LEDs), organic light-emitting diodes (OLED), thin film electroluminescent (TFEL), or any other luminescent element that is suitably sized for the robotic arm 104, according to the features of this application. The light source 512 may be used to test an ambient light sensor (ALS) of the electronic device to ensure proper functionality. The robotic arm 104 may also include a radio frequency antenna 514 (e.g., Wi-Fi antenna, cellular antenna, Bluetooth antenna, nearfield communication antenna, RFID tag or tag reader, etc.). The radio frequency antenna 514 may be used to ensure proper functionality of the radio frequency capability of the electronic device under test (e.g., ability to connect, data rate, power output, range, etc.). In other examples, the radio frequency antenna 514 may be coupled to the table assembly 102. The robotic arm 104 may further include a speaker, which may be used to test a microphone of the electronic device under test. While not shown, the table assembly and/or robotic arm 104 may additionally or alternatively include a fingerprint sensor probe to test a finger print sensor of the electronic device, a global positioning sensor (GPS) emitter to test functionality of a GPS module of the electronic device, an AM/FM radio emitter to test an AM/FM radio module of the electronic device, or any other stimulators to test systems of the electronic device. In some examples, one or more sensors and/or one or more stimulators may comprise a part of the table assembly 102. For example, one or more sensors and/or one or more stimulators may comprise part of the fixture 408 of the table assembly 102. In some examples, one or more wireless antennae may be coupled to the table assembly 102. Sensors and/or stimulators included in the table assembly 102 may be in addition to or instead of the sensors and/or stimulators of the robotic arm 104.

Figure 6:
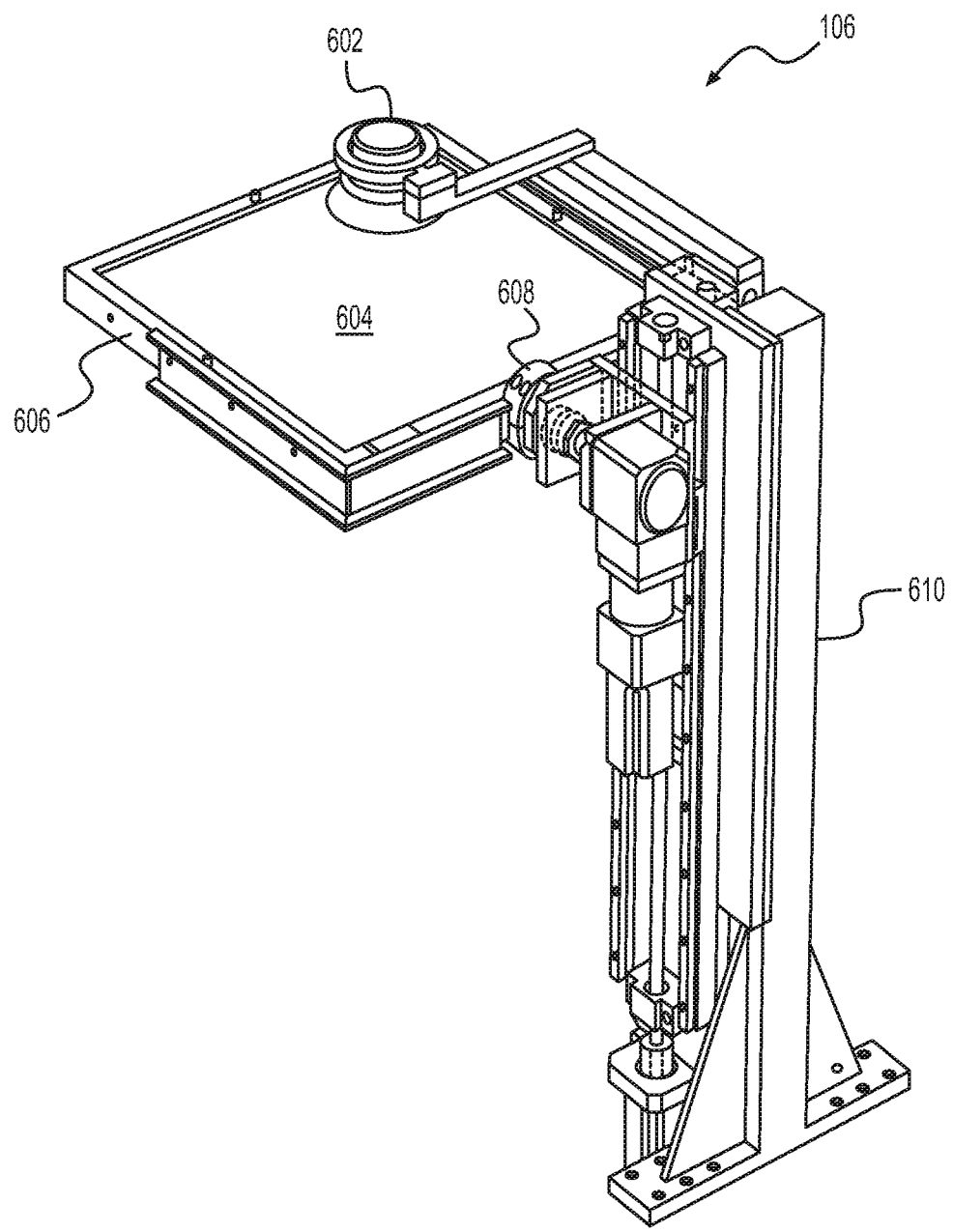
FIG. 6 is a detailed view of the camera test assembly of the example multi-function test machine of FIG. 1.

FIG. 6 depicts a detailed view of the camera test assembly 106. The camera test assembly 106 may be coupled to a lower portion of the stationary frame 402 of the table assembly 102, such that the camera test assembly 106 may be positioned below the rotatable plate 406.

The camera test assembly 106 may include a relay lens 602. The movable frame 404 may move in conjunction with (e.g., in coordination with, complimentary to) the camera test assembly 106 to align a camera of the electronic device with the relay lens 602 of the camera test assembly 106. The camera test assembly 106 may also include a chart 604, of which a camera of the electronic device may capture an image. The chart 604 may be held by a chart holder 606. The relay lens 602 may be movable to adjust a position of the relay lens 602 relative to the camera of the electronic device and/or the chart 604. The relay lens 602 may be positioned in an optical path between the camera of the electronic device and the chart 604. The chart holder 606 may also be movable in a vertical direction and may also be rotationally movable. This allows for an image to reside on two sides of the chart 604. The camera test assembly 106 may also include a light source 608 to illuminate the chart 604. The chart 604 may be printed on paper or any other media. In some examples, the chart 604 may be a projected image or may be displayed by a screen. In such an embodiment, the screen may be a high contrast screen able to simulate a printed page. The camera test assembly 106 may include an adjustable stand 610. The adjustable stand 610 may be able to move the chart holder 606 into a position that aligns the chart 604 relative to the camera of the electronic device under test and/or to adjust a distance between the chart and the camera of the electronic device under test. In other examples, the adjustable stand 610 may be configured to individually and/or collectively move individual parts of the camera test assembly 106 such as the relay lens 602, chart 604, chart holder 606, and/or the light source 608.

Figure 7:
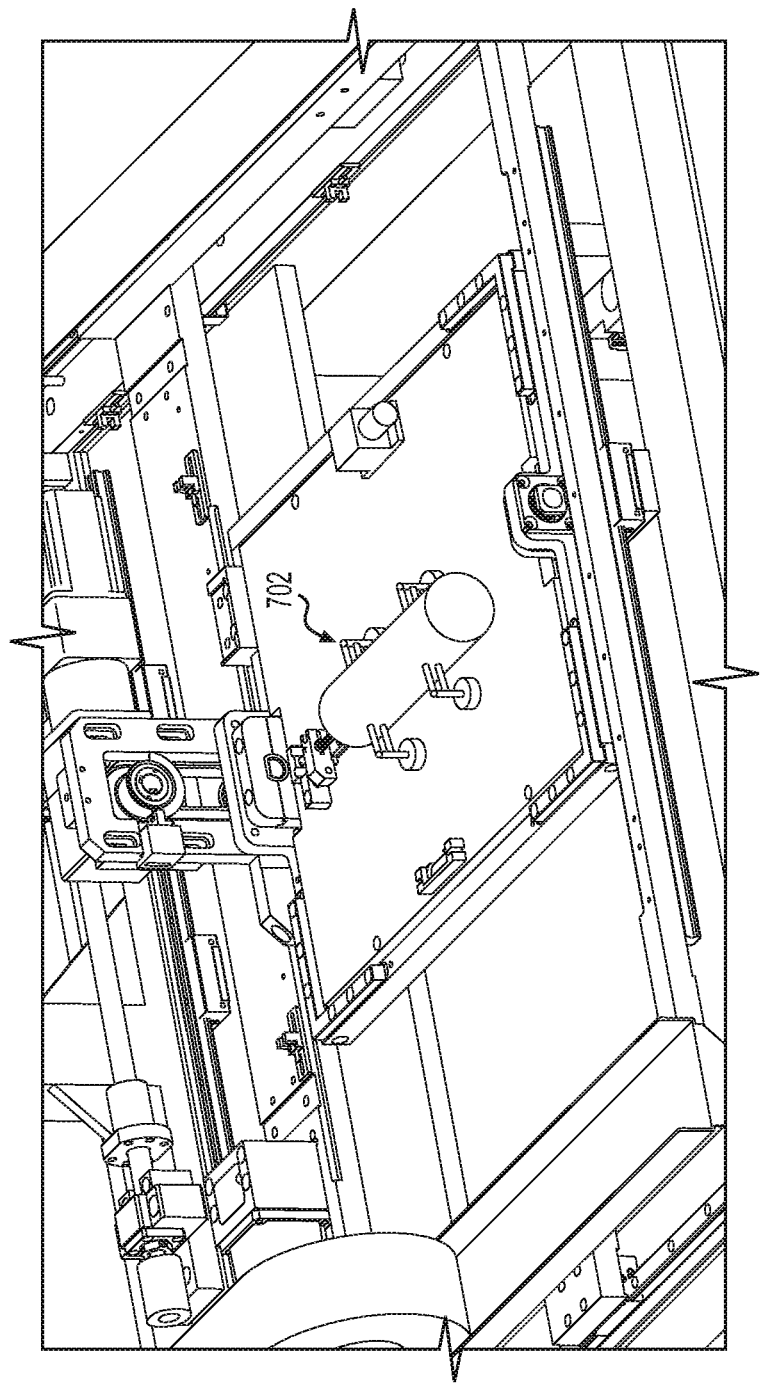
FIG. 7 is a detailed view of the table assembly of a second example multi-function test machine, holding a cylindrical electronic device.

FIG. 7 depicts another embodiment of the multi-function test machine 100. The embodiment in FIG. 7 depicts a second type of fixture 702 being configured to hold a cylindrical device. In FIG. 7, the cylindrical device is depicted lying on its side. However, in other examples, the cylindrical device may be held in the fixture in a vertical position with the axial center of the cylinder being substantially parallel with the z axis. The cylindrical device may or may not include a display screen or camera.

Figure 8:
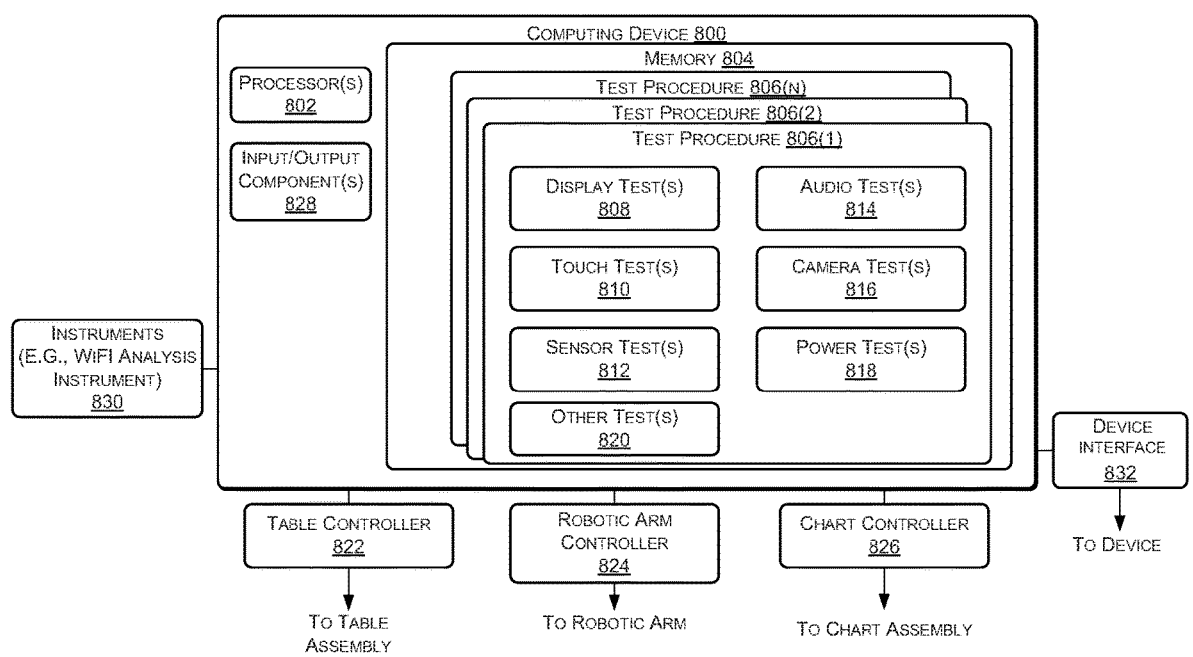
FIG. 8 is a block diagram illustrating logical components of an example multi-function test machine, such as that shown in FIG. 1.

FIG. 8 depicts an example computing device 800 of the multi-function test machine 100. The computing device 800 may be communicatively coupled to one or more of the table assembly 102, the robotic arm 104, and/or the camera test assembly 106. The computing device 800 includes one or more processors 802 and memory 804. The memory 804 may store multiple test procedures 806(1), 806(2), . . . 806(N) (collectively "test procedures 806") which may be executed by the one or more processors 802 to test an electronic device. Each test procedure 806 includes a set of instructions to cause the various components and assemblies of the multi-function test machine 100 to perform operations to test the functionality of a particular type of electronic device. The computing device 800 may store a separate set of test procedures 806 for each device (or each type or category of device) that the multi-function test machine 100 is configured to test. For example, test procedure 806(1) may be used to test a tablet, test procedure 806(2) may be used to test a voice controlled assistant, etc. In the illustrated example, test procedures 806(1) are configured to test multiple systems of the electronic device. Specifically, in this example the test procedures 806(1) include display tests 808, touch tests 810, sensor tests 812, audio tests 814, camera tests 816, power tests 818, and/or other tests 820.

In some examples, the computing device 800 may determine (e.g., by optical image recognition, based on the positioning of the fixture to accommodate the device, and/or based on communication with the device itself) a type of electronic device that is placed in the fixture 408, and may select a set of test procedures 806 corresponding to the electronic device placed in the fixture. The computing device 800 can then execute the selected test procedures 806 to test functionality of the systems of the electronic device.

In some examples, a human operator may operate or oversee the test procedure 806. However, in other examples, portions of the test procedure 806 or the entire test procedure 806 may be automated. The test procedure 806 may cause the multi-function test machine 100 to concurrently test two or more systems of the electronic device under test. The computing device 800 may also include either a wired or wireless interface for communication with the electronic device under test. The computing device 800 may further be communicatively coupled to controllers for the different assemblies of the multi-function test machine 100. For example, the computing device 800 may communicate with a table controller 822, robotic arm controller 824, and/or chart controller 826. These controllers may be implemented using software or hardware, or a combination thereof. While three controllers are shown, each controller may represent multiple individual controllers (e.g., separate controllers for each motor, stimulator, and/or sensor included in the assembly), or a single controller may be used to control all combinations of two or more of the assemblies. The computing device 800 may also be communicatively coupled to one or more instruments 830 (e.g., WiFi analysis instrument(s), GPS test instrument(s), etc.), which may provide additional stimulus, analysis of signals sensed by one or more sensors of the multi-function test machine 100 or sensors of the instruments 830, and/or analysis of signals or data detected by or received from a device under test. The computing device 800 is also communicatively coupled to the electronic device under test via a device interface 832.

The computing device 800 may also include one or more input/output components 828 through which an operator may interact with the computing device 800. By way of example and not limitation, the input/output component(s) 828 of the computing device may include a physical or graphical user interface (UI), keyboard, keypad, mouse, touch screen, camera, microphone, speakers, printer, scanner, or any other conventional input and/or output components.

The foregoing are but a few examples of multi-function test machines according to this application. One having skill in the art will understand other embodiments that are achievable within the scope of this disclosure. For example, the multi-function test machine 100 may comprise more or less assemblies and may comprise more or less sensors, stimulators, cameras, antennae, light sources, gauges, etc. The multi-function test machine 100 may further include one or more computing devices communicatively coupled to the multi-function test machine 100. The computing device(s) may be remotely controlled, according to some examples. The multi-function test machine 100 has been described as including various movable parts. These movable parts may be movable by electric motors, hydraulics, pneumatics, or a combination of these.

Example Test Process

Figure 9:
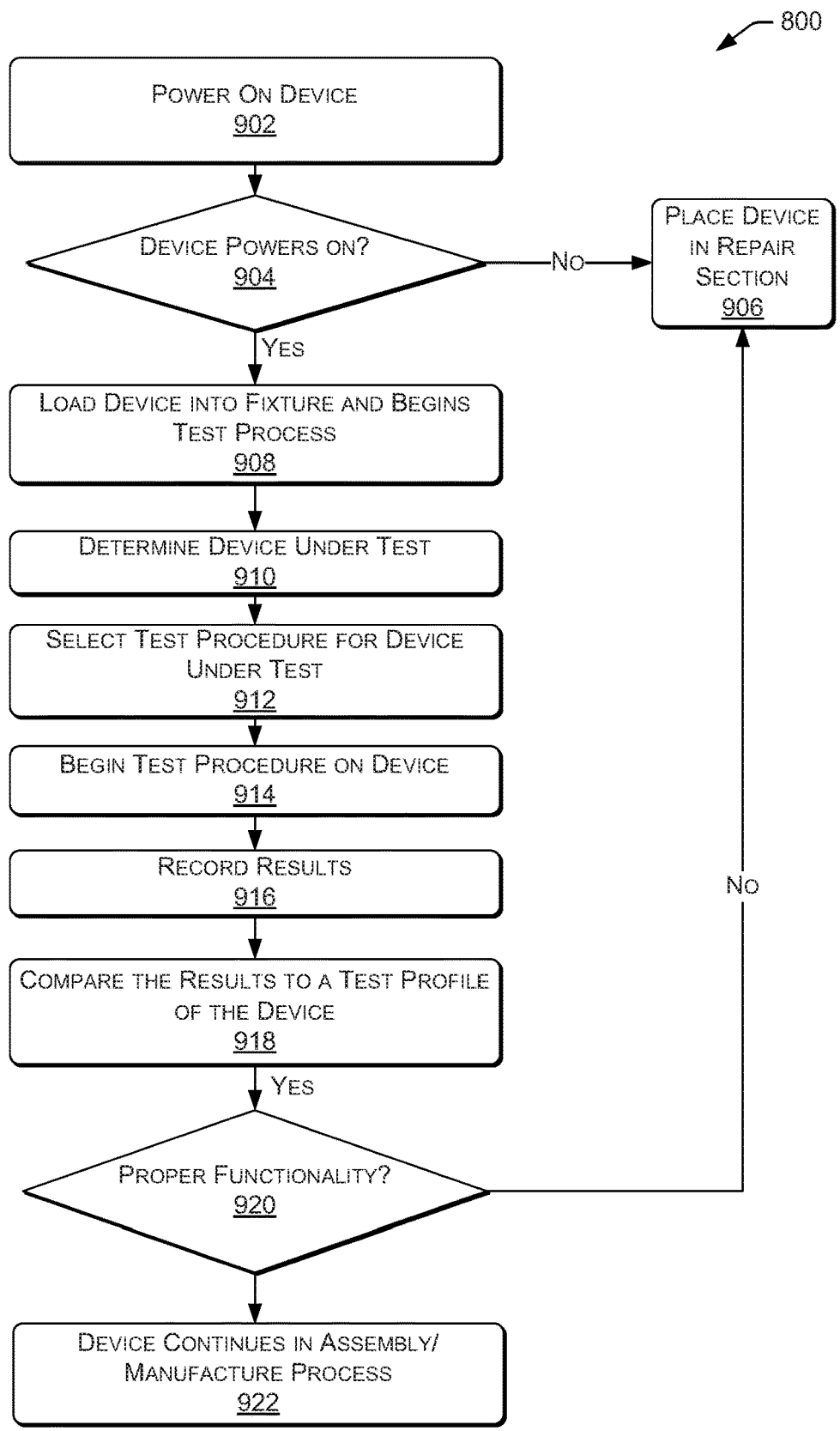
FIG. 9 is a flowchart illustrating an example process of testing multiple functions of an electronic device simultaneously.

FIG. 9 depicts a flow diagram of an example test process 900 for functional testing of an electronic device. For ease of explanation, the process 900 is described as being performed at least in part by the multi-function test machine 100. However, in other examples, the example test process 900 may be performed by other functional test machines. While this figure describes a human operator initiating and/or administering this process, in other examples, a fully automated system may be used. For example, a pick-and-place robot and/or a conveyor system may be used to place the device in the multi-function test machine, and upon the conclusion of the test, may place the device in a repair bin or pass it on for further processing, assembly, or packaging.

The example test process 900 (as well as each process described herein) is illustrated as a logical flow graph, each operation of which represents a sequence of operations that can be implemented by hardware, software, or a combination thereof. In the context of software, the operations represent computer-executable instruction stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer readable storage media, which may include hard drives, floppy diskettes, optical disks, CD-ROMs, DVDs, read-only memories (ROMs), random access memories (RAMs), EPROMS, EEPROMS, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, unless otherwise noted, the order in which the operations are described is not intended to be construed as a limitation, and any number of the described operations can be combined in any order and/or in parallel to implement the process.

At 902, an operator picks an electronic device from the assembly/manufacture line. The operator may then press a power button of the device and/or may electronically attach the device to an external power source.

At 904, the operator and/or a computing device coupled to the multi-function test machine may determine whether the electronic device powers on correctly. In one example, the operator may communicatively attach the electronic device to a computing device so the computing device may record the results as the electronic device attempts to power on. The operator and/or computing device may determine whether any malfunction occurs before, during, or after the device is powered on. If the operator and/or computing device determines that the device powers on without malfunction, the test proceeds to a next step in the test process. However, if at operation 904 the operator and/or the computing device determines that the electronic device either failed to power on or there was a type of malfunction during, before, or after the electronic device powered on, the operator may place the electronic device in a repair section 906. Types of malfunction may be, but are not limited to, portions of the device failing to power on, device taking longer than a predetermined time to power on, device freezing upon powering on, device overheating upon powering on, etc.

At 908, the operator may load the device into the fixture 408. Prior to placing the device into the fixture 408, or after placing the device in the fixture 408, the operator may communicatively couple the electronic device to the computing device. This allows the computing device to read results during and after the testing process, described further herein below. Once the electronic device is loaded into the fixture 408, the operator may begin the test via input/output components 828 on the computing device 800. The operator may control the test process, or the test process may be entirely or partly automated.

At 910, the computing device 800 may determine or identify the type of device under test by the operator selecting from software on the computing device a type of electronic device being tested, by optical image recognition of the device being tested, based on the positioning of the fixture to accommodate the device being tested, and/or based on wired or wireless communication with the device itself (e.g., via USB, near field communication, WiFi, Bluetooth, or the like).

At 912, the computing device 800 may select a test procedure 806 from the available test procedures stored on the computing device. The test procedure 806 may be selected based on the determination or identification of the type of the device under test.

At 914, the computing device may run the selected test procedure 806 to test the various functions of the electronic device. During the test procedure 806, the multi-function test machine may test two or more systems of the device concurrently. During certain portions of the test procedure 806, the multi-function test machine may test less than or more than two systems of the device concurrently. Examples of systems of the electronic device to be tested include, by way of example and not limitation, display tests, touch tests, sensor tests, audio tests, camera tests, power tests, and/or other tests.

Testing the display system of the device may include testing the basic red, green, and blue capabilities of the display screen, testing for dead pixels and/or hot pixels, and/or testing for dark corners and/or display mura. Testing the touch system of the device may include testing one point touch across a plurality of positions on the touch screen, testing recognition of multiple concurrent touches (so called multi-touch functionality), or the like.

Testing various sensors of the device may include testing an accelerometer, gyroscope, and/or magnetometer. For instance, in one specific example, the multi-function test machine 100 may rotate the rotatable plate 406 and record the response of the inertial sensors of the electronic device (i.e. accelerometer, gyroscope, magnetometer, etc.). For example, the rotatable plate 406 may be repositioned and the resulting response from the sensors may be recorded. Testing other sensors may include testing the ambient light sensor (ALS) of the device. In that case, the multi-function test machine 100 may bring a light source 512 coupled to the robotic arm 104 into proximity of the ALS and record the resulting response from the ALS. The multi-function test machine 100 may further test a Hall effect sensor of the electronic device by moving an electromagnet probe 510 (or a permanent magnet probe) into the proximity of the Hall sensor and recording the resulting response from the Hall sensor. The multi-function test machine 100 may also test buttons or other physical controls on the device. These buttons or other controls may include, but are not limited to power buttons, home buttons, keys of a keyboards, volume up/down buttons, microphone or voice input buttons, playback control buttons, etc. The multi-function test machine 100 may use a button press probe 508 to actuate the buttons on the device and record a resulting response from the electronic device. The resulting response may be sensed by one or more sensors of the multi-function tester and/or may be received from the electronic device itself (e.g., indicating that the device detected that the button had been depressed or otherwise selected).

The multi-function test machine 100 may also test the audio system of the device. The audio system includes, but is not limited to one or more microphones, speakers, audio jacks, etc. The multi-function test machine 100 may send instructions to the electronic device to output a sound through one or more speakers of the device and one or more microphones coupled to the table assembly 102 and/or the robotic arm 104 may be used to measure the output sound. The multi-function test machine 100 may also output a sound from one or more speakers coupled to the table assembly 102 and/or the robotic arm 104 to test one or more of the microphones of the electronic device. The multi-function test machine 100 may also test output and input through the audio jack. The audio system test measures the frequency and/or the total harmonic distortion (THD) of the audio system.

Testing the camera system of the electronic device may include testing one or more front facing cameras (FFCs), rear facing cameras (RFCs), or other cameras of the electronic device. For example, the multi-function test machine 100 may send instructions to the electronic device to capture an image of the chart 604, using the FFC, located beneath the device. The electronic device may be placed in the fixture 408 with the FFC facing in a substantially downward direction. Once the multi-function test machine 100 completes testing of the FFC, the multi-function test machine 100 may rotate the rotatable plate 406 180 degrees such that the RFC may be facing in a substantially downward direction. The multi-function test machine 100 may then send instructions to the electronic device to capture an image of the chart 604 using the RFC. The multi-function test machine may analyze the images captured by the one or more cameras of the electronic device to determine one or more of offset left-right and up-down, rotation, dark corners and abnormal color, black and white images, etc. The multi-function test machine 100 may also send instruction to the electronic device to turn on and off an LED flash or other light emitting source.

Testing the wireless system of the electronic device may include testing the Wi-Fi, Bluetooth™, cellular, and other wireless communication capabilities of the electronic device. One or more wireless radio frequency antennae coupled to the robotic arm 104 and/or the table assembly 102 may transmit or receive signals from/to corresponding antennae of the electronic device. The wireless antennae may test the output power, sensitivity, etc., of the electronic device.

Any or all of the previously described tests may be conducted concurrently with one or more other tests. Testing systems concurrently cuts back on the total test time of the device and accelerates the assembly/manufacture line.

At 916, the multi-function test machine 100 may record the results of each of the tests conducted during the test procedure. Recording the results at 916 may happen at the conclusion of a test procedure, or may happen while the test procedure is taking place. The results of test procedure may be stored in the memory 804 of the computing device 800 of the multi-function test machine 100.

At 918, the multi-function test machine 100 may compare the recorded results of each of the tests with a predetermined test profile for an electronic device of the type being tested, which test profile may be stored on the computing device 800. The computing device 800 may automatically analyze the recorded results, or may prompt the operator to review the recorded results.

At 920, the multi-function test machine 100 may determine, based at least in part on the comparing 918, whether one or more systems of the electronic device are functioning properly. If one or more of the systems are not functioning properly, the operator may, at 906, send the electronic device to the repair section. In some examples, the computing device 800 may skip steps 916 and 918 and simply determine at 920 automatically if the systems of the electronic device are functioning properly.

At 920, if the multi-function test machine 100 determines that the systems of the electronic device are working properly, the operator will send the electronic device to continue in the assembly/manufacture process 922. However, if the multi-function test machine 100 determines that one or more systems of the electronic device are not working properly, the operator may send the electronic device to a repair section 906.

Figure 10:
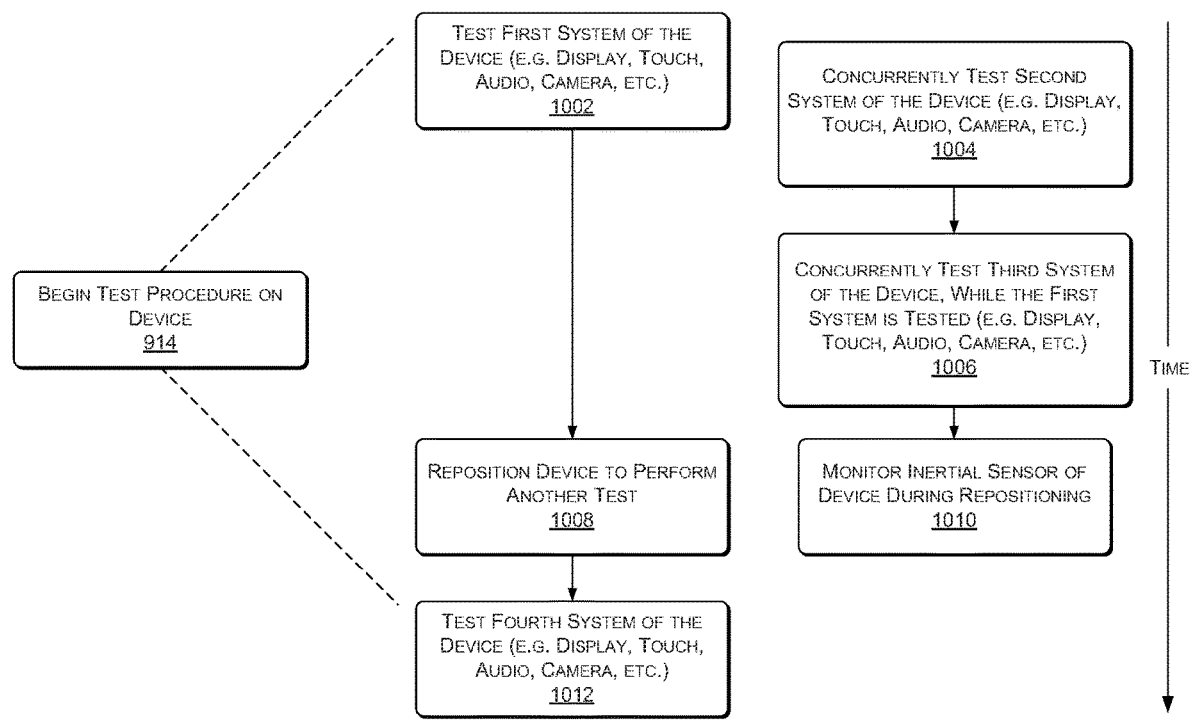
FIG. 10 depicts an example test procedure of the multi-function test machine.

FIG. 10 depicts additional details of example test procedure operation 914. For example, the multi-function test machine may, at 1002, test a first system of the electronic device while, at 1004, testing a second system of the electronic device concurrently with testing the first system of the electronic device. In some examples, the multi-function test machine 100 may, at 1006, test a third system of the electronic device concurrently with testing the first system of the electronic device and with testing the second system of the electronic device. In other examples, the multi-function test machine 100 may, at 1006, test the third system, after testing the second system, but concurrently with testing the first system. In other examples, the multi-function test machine may test more than three systems of the electronic device concurrently. The multi-function test machine 100 may, at 1008, reposition the device to perform an additional test. While performing the repositioning at 1008 is taking place, one or more inertial sensors of the device may be monitored, at 1010, to ensure proper functionality of the inertial sensor(s). Upon completing the repositioning of the device, at 1008, a fourth system of the device may be tested at 1012.

CONCLUSION

While various examples and embodiments are described individually herein, the examples and embodiments may be combined, rearranged and modified to arrive at other variations within the scope of this disclosure.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A multi-function tester comprising:
a table assembly comprising:
  a fixture to hold an electronic device;
  a first antenna to communicate with a wireless radio of the electronic device;
a robotic arm coupled to the table assembly, the robotic arm comprising:
  at least one stimulator to stimulate an input of the electronic device; and
  at least one sensor to receive an output from the electronic device, the at least one sensor comprising at least one of:
    a still camera,
    a video camera,
    a light sensor,
    a microphone,
    an inertial sensor,
    an optical sensor,
    a laser scanner, or
    a second antenna;
a camera test assembly that supports a chart at a position aligned with a camera of the electronic device, the chart including an image that is within a field of view of the camera of the electronic device, wherein image data captured by the camera of the electronic device depicts the image and is used to test a functionality of the electronic device;
an adjustable stand;
a relay lens coupled to the adjustable stand, the relay lens disposed within an optical path between the camera of the electronic device and the chart, wherein the relay lens is adjustable between the camera of the electronic device and the chart via the adjustable stand; and
a computing device communicatively coupled to the table assembly, the robotic arm, and the camera test assembly, the computing device comprising:
  one or more processors;
  a communication interface to communicate with the electronic device; and
  memory storing a test procedure for the electronic device that, when executed by the one or more processors, causes the multi-function tester to concurrently test at least two of:
    the wireless radio of the electronic device;
    the camera of the electronic device based at least in part on the image data captured by the camera of the electronic device;
    the input of the electronic device; or
    the output of the electronic device.

2. The multi-function tester of claim 1, further comprising an L-shaped bracket coupling the robotic arm to the table assembly, such that the robotic arm is disposed above a top of the table assembly, and wherein:
the at least one stimulator of the robotic arm comprises one or more of:
  an electromagnet probe;
  a touch screen probe;
  a button press probe;
  a speaker;
  a light source; or
  another antenna; and
the at least one sensor of the robotic arm comprises one or more of:
  a microphone;
  a camera; or
  the another antenna.

3. The multi-function tester of claim 1, wherein:
the camera test assembly further comprises a chart holder to hold the chart; and
the adjustable stand is configured to move the chart holder to position the chart at the position aligned with the camera of the electronic device.

4. The multi-function tester of claim 1, wherein the table assembly further comprises:
a stationary frame having a substantially planar top surface;
a movable frame that is movable in at least one axis substantially parallel to the substantially planar top surface of the stationary frame; and
a rotatable plate coupled to, and movable with, the movable frame, wherein:
  the fixture is mounted to the rotatable plate; and
  the rotatable plate is rotatable about an axis parallel to the substantially planar top surface of the stationary frame to rotate the fixture and the electronic device 180 degrees.

5. The multi-function tester of claim 4, wherein the rotatable plate includes one or more holes through which the camera of the electronic device captures the image data depicting the image.

6. A device comprising:
a table assembly configured to hold an electronic device;
one or more stimulators to stimulate one or more inputs of the electronic device;
one or more sensors to receive one or more outputs of the electronic device;
a communication interface to communicate with the electronic device;
a camera test assembly including:
a chart aligned with a camera of the electronic device; and
a relay lens interposed in an optical path between the chart and the camera of the electronic device, wherein the relay lens is configured to move via an adjustable stand;
one or more processors; and
memory storing instructions that, when executed by the one or more processors, cause the one or more processors to perform operations comprising concurrently testing the camera of the electronic device and multiple systems of the electronic device using at least one of the one or more stimulators or at least one of the one or more sensors.

7. The device of claim 6, wherein:
the one or more stimulators comprises at least one of:
an electromagnet probe;
a touch screen probe;
a button press probe;
a loudspeaker;
a light source; or
an antenna; and
the one or more sensors comprises at least one of:
a microphone;
a camera;
a light sensor; or
an antenna.

8. The device of claim 6, wherein the chart includes an image to test a functionality of the camera of the electronic device.

9. The device of claim 6, wherein:
the camera test assembly further includes a chart holder to hold the chart; and
the adjustable stand is configured to move the chart holder to align the chart with the camera of the electronic device.

10. The device of claim 6, wherein the table assembly includes:
a stationary frame having a substantially planar top surface;
a movable frame that is movable in at least one axis substantially parallel to the substantially planar top surface; and
a rotatable plate coupled to, and movable with, the movable frame, wherein the rotatable plate is rotatable about an axis parallel to the substantially planar top surface to rotate the electronic device 180 degrees.

11. The device of claim 6, further comprising a robotic arm coupled to the table assembly, and wherein the robotic arm includes at least one of:
the one or more stimulators; or
the one or more sensors.

12. The device of claim 6, wherein concurrently testing the multiple systems comprises concurrently testing at least two of:
a wireless radio of the electronic device;
a touch screen or a touch sensor of the electronic device;
a physical button of the electronic device;
an inertial sensor of the electronic device;
a magnetic sensor of the electronic device;
a light sensor of the electronic device;
a loudspeaker of the electronic device;
a microphone of the electronic device; or
a display of the electronic device.

13. The device of claim 6, wherein the memory stores instructions that, when executed by the one or more processors, cause the one or more processors to perform operations comprising determining a test procedure for the electronic device based at least in part on a device type of the electronic device, and
wherein concurrently testing the camera of the electronic device and the multiple systems of the electronic device is based at least in part on the test procedure.

14. A system comprising:
a table assembly to hold an electronic device;
at least one stimulator to stimulate an input of the electronic device;
at least one sensor to receive an output of the electronic device;
a camera test assembly including:
a chart at a position aligned with a camera of the electronic device;
an adjustable stand; and
a relay lens coupled to the adjustable stand and configured to be positioned within an optical path between the camera of the electronic device and the chart; and
a computing device comprising:
one or more processors;
a communication interface to communicate with the electronic device; and
memory storing instructions that, when executed by the one or more processors, causes the system to concurrently test the camera of the electronic device and at least one of:
the input of the electronic device; or
the output of the electronic device.

15. The system of claim 14, further comprising a robotic arm, wherein the robotic arm includes at least one of:
the at least one stimulator; or
the at least one sensor.

16. The system of claim 14, wherein the table assembly includes:
a stationary frame having a substantially planar top surface;
a movable frame that is movable in at least one axis substantially parallel to the substantially planar top surface of the stationary frame; and
a rotatable plate coupled to, and movable with, the movable frame, wherein the rotatable plate is rotatable about an axis parallel to the substantially planar top surface of the stationary frame to rotate the electronic device 180 degrees.

17. The system of claim 14, wherein the memory stores instructions that, when executed, causes the system to actuate the camera test assembly to position the relay lens at a position between the camera of the electronic device and the chart.

18. The system of claim 14, wherein:
the at least one stimulator comprises at least one of:
- an electromagnet probe;
- a touch screen probe;
- a button press probe;
- a loudspeaker;
- a light source; or
- an antenna; and the at least one sensor comprises at least one of:
- a microphone;
- a camera;
- a light sensor; or
- an antenna.

19. The system of claim 14, wherein the memory stores instructions that, when executed by the one or more processors, causes the system to actuate the camera test assembly to align the chart with the camera of the electronic device.

20. The system of claim 14, wherein testing the at least one of the input of the electronic device or the output of the electronic device comprises testing at least one of:
- a physical button of the electronic device;
- a wireless radio of the electronic device;
- a touch screen or a touch sensor of the electronic device;
- an inertial sensor of the electronic device;
- a magnetic sensor of the electronic device;
- a light sensor of the electronic device;
- a loudspeaker of the electronic device;
- a microphone of the electronic device; or
- a display of the electronic device.

* * * * *